United States Patent [19] [11] 4,264,903
Bigelow [45] Apr. 28, 1981

[54] CAPACITIVE TOUCH CONTROL AND DISPLAY

[75] Inventor: John E. Bigelow, Saratoga, N.Y.

[73] Assignee: General Electric Company, Schenectady, N.Y.

[21] Appl. No.: 36,558

[22] Filed: May 7, 1979

Related U.S. Application Data

[63] Continuation-in-part of Ser. No. 914,373, Jun. 12, 1978, which is a continuation-in-part of Ser. No. 879,368, Feb. 21, 1978, Pat. No. 4,158,216.

[51] Int. Cl.³ .............................................. G06F 3/03
[52] U.S. Cl. .................................. 340/365 C; 178/19; 361/280; 361/292; 361/300
[58] Field of Search ............ 340/365 R, 365 C, 365 S, 340/200, 347 P; 200/DIG. 1, 52 R; 361/280, 292, 298, 299, 300, 287; 178/19; 324/60 C, 61 R

[56] References Cited

U.S. PATENT DOCUMENTS

| 3,198,937 | 8/1965 | Wooster | 340/200 |
| 3,760,392 | 9/1973 | Stich | 340/200 |
| 4,007,454 | 2/1977 | Cain et al. | 340/200 |
| 4,058,765 | 11/1977 | Richardson et al. | 340/200 |
| 4,087,625 | 5/1978 | Dym et al. | 178/19 |
| 4,103,252 | 7/1978 | Bobick | 340/365 C |
| 4,129,747 | 12/1978 | Pepper | 340/365 C |
| 4,177,421 | 12/1979 | Thornburg | 340/365 C |

Primary Examiner—James J. Groody
Attorney, Agent, or Firm—Geoffrey H. Krauss; Marvin Snyder; James C. Davis

[57] ABSTRACT

A control for use upon a solid panel, devoid of control shaft apertures, allows data entry by rotational positioning of a human member, such as one's finger, about a pattern of a plurality of interdigitated electrodes formed upon an interior surface of the panel. The position of the member varies the capacitance between adjacent ones of the electrodes, with position-decoding electronics energizing successive ones of the plurality of electrodes with successive phases of a master signal and recovering information relating the phase of the signal returned from the control to the position of the member. A light-emitting display may be positioned behind the panel to indicate the index of the control knob by a variable-length circular bar of light, a digitized display and the like.

14 Claims, 14 Drawing Figures

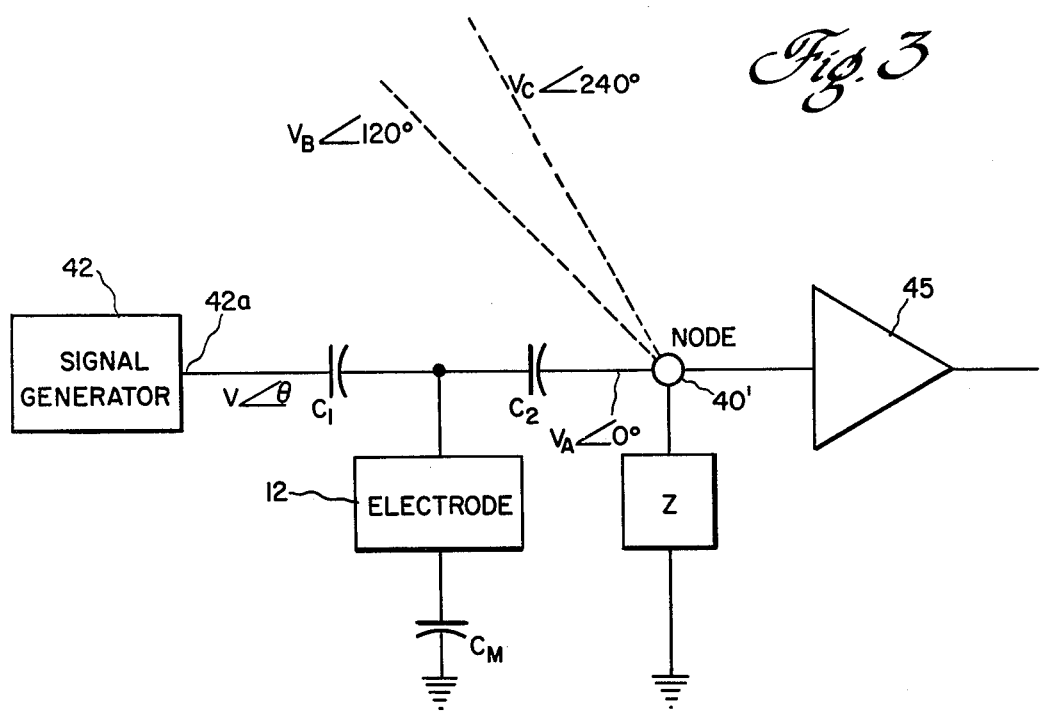
*Fig. 3*
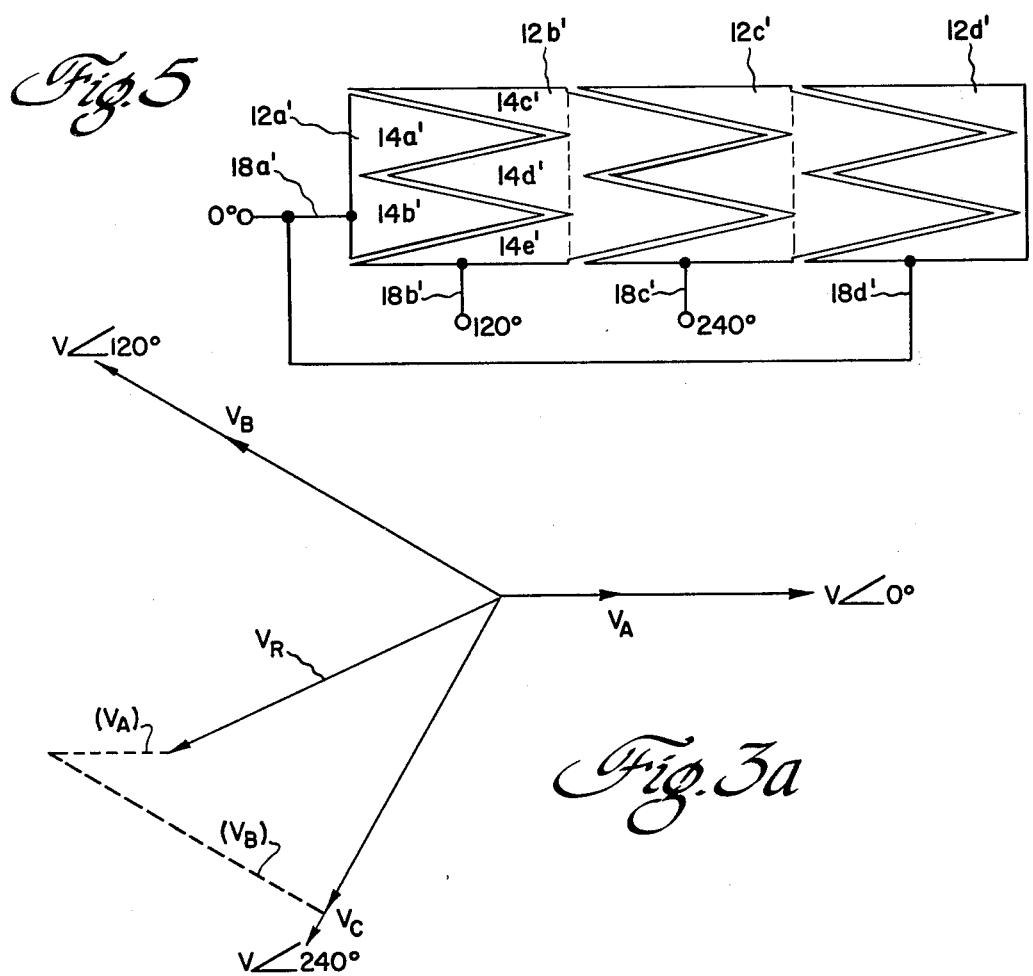
*Fig. 5*
*Fig. 3a*

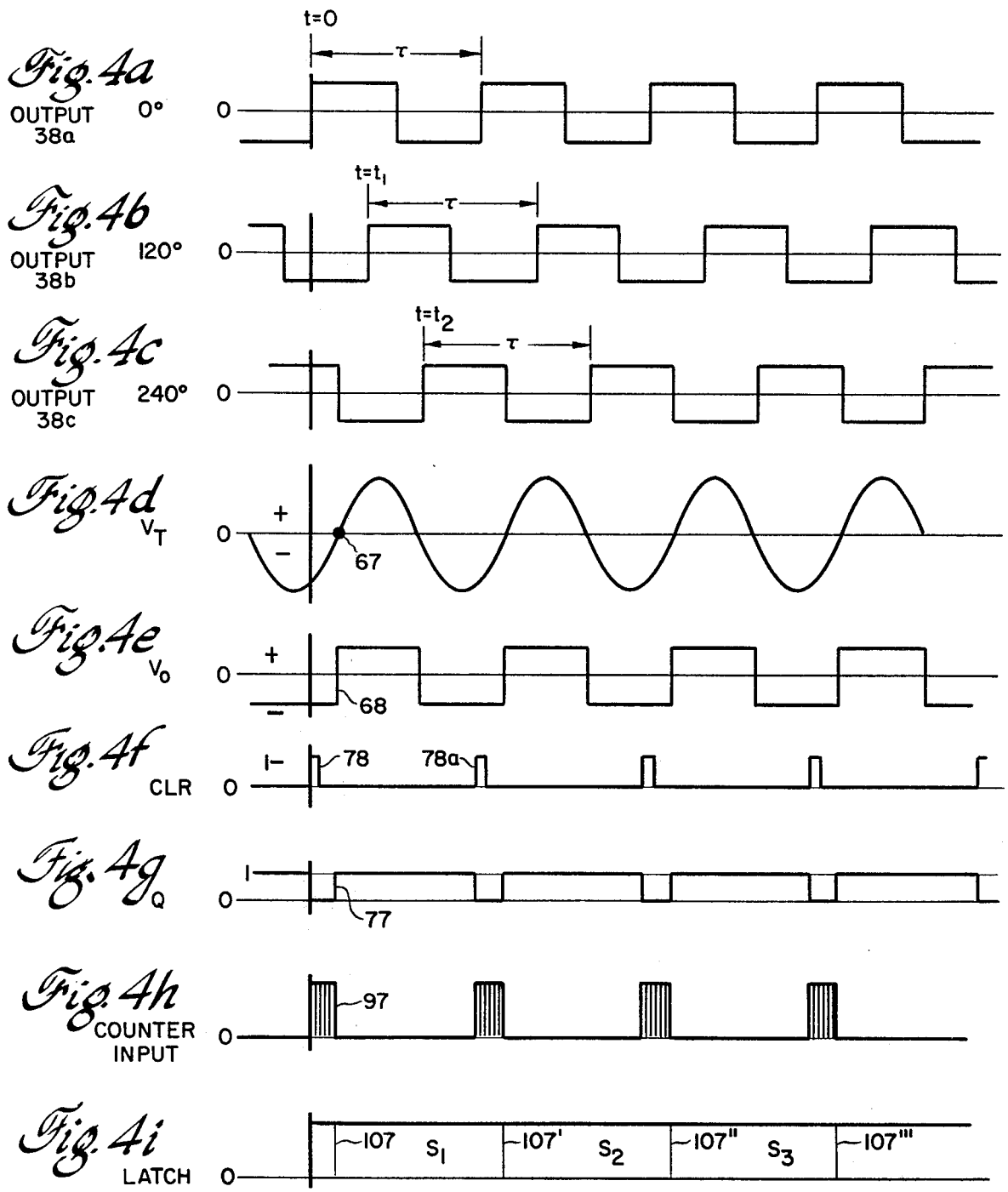

CAPACITIVE TOUCH CONTROL AND DISPLAY

BACKGROUND OF THE INVENTION

This application is a continuation-in-part of application Ser. No. 914,373, filed June 12, 1978, which is a continuation-in-part of application Ser. No. 879,368, filed Feb. 21, 1978, now U.S. Pat. No. 4,158,216, issued June 12, 1979.

The present invention is directed toward control system data entry apparatus and, more particularly, to a novel capacitive touch entry control which can be fabricated upon a solid panel without the need for forming openings through the panel.

It has been found desirable to use capacitive touch entry controls in the electronic control systems of many types of apparatus, and particularly with home appliances. Such capacitive touch entry controls have the advantage of relatively low cost and ease of fabrication, but have the disadvantage of requiring a relatively large panel area if a fine analog setting must be provided. Accordingly, a capacitive touch entry control facilitating a fine degree of manual control is desirable.

BRIEF SUMMARY OF THE INVENTION

In accordance with the invention, a capacitive touch control, capable of fabrication upon a solid insulative panel, utilizes a plurality M of interdigitated input electrodes fabricated upon the surface of the panel facing the interior of the equipment, and preferably arranged along a geometric curve, e.g. linearly along a line or annularly about a central point. Each of a plurality M of nodes, each formed at one of the M interdigitated electrodes, are driven with substantially equal amplitude waveforms having a phase difference between successive phases coupled to successive nodes, of about (360/M) degrees. The emplacement of a member, such as a human digit and the like, upon the exterior surface of the panel and at a point upon the electrode pattern, causes an additional capacitance to be formed between a pair of adjacent electrodes and varies the coupling therebetween in accordance with the position of the member, whereby the phase of the signal recoverable from the electrodes shifts by an amount related to the position of the member touching the panel. The phase is recovered and digitized to facilitate output of a signal related to input member position.

In a preferred embodiment of the present invention, three interdigitated electrodes, with each electrode having a total angular extend of 240°, are formed in an annular pattern and used with a three-phase driving circuit. The position of the control is indicated by a light-emitting display formed by a plurality of light-emitting areas disposed about the major portion of the circumference of a circle having the same center as the central axis of the annular electrode pattern and having the light emitting areas positioned to be visible through the transparent electrodes, which may be formed of indium tin oxide and the like conductive, transparent materials. A digitized display may be utilized in parallel connection with the peripheral display, or in lieu thereof. In another preferred embodiment, the electrodes are positioned in a linear array.

Accordingly, it is an object of the present invention to provide a novel multi-phase capacitive touch control which may be utilized without providing openings through a panel to which the control is attached.

It is another object of the present invention to provide a novel multi-phase capacitive touch control having a light-emitting display indicative of the control knob position.

These and other objects of the present invention will become apparent to those skilled in the art upon consideration of the following detailed description taken in conjunction with the drawings.

DESCRIPTION OF THE DRAWINGS

FIGS. 3 and 3a are, respectively, a schematic diagram and a phase diagram, useful in understanding operation of the capacitive touch control system of FIGS. 1 and 2;

FIGS. 4a–4i are a set of coordinated signal waveforms illustrated of operation of the circuitry of FIG. 2; and FIG. 5 is a plan view of one presently preferred linear electrode array.

DETAILED DESCRIPTION OF THE INVENTION

Figure 1:
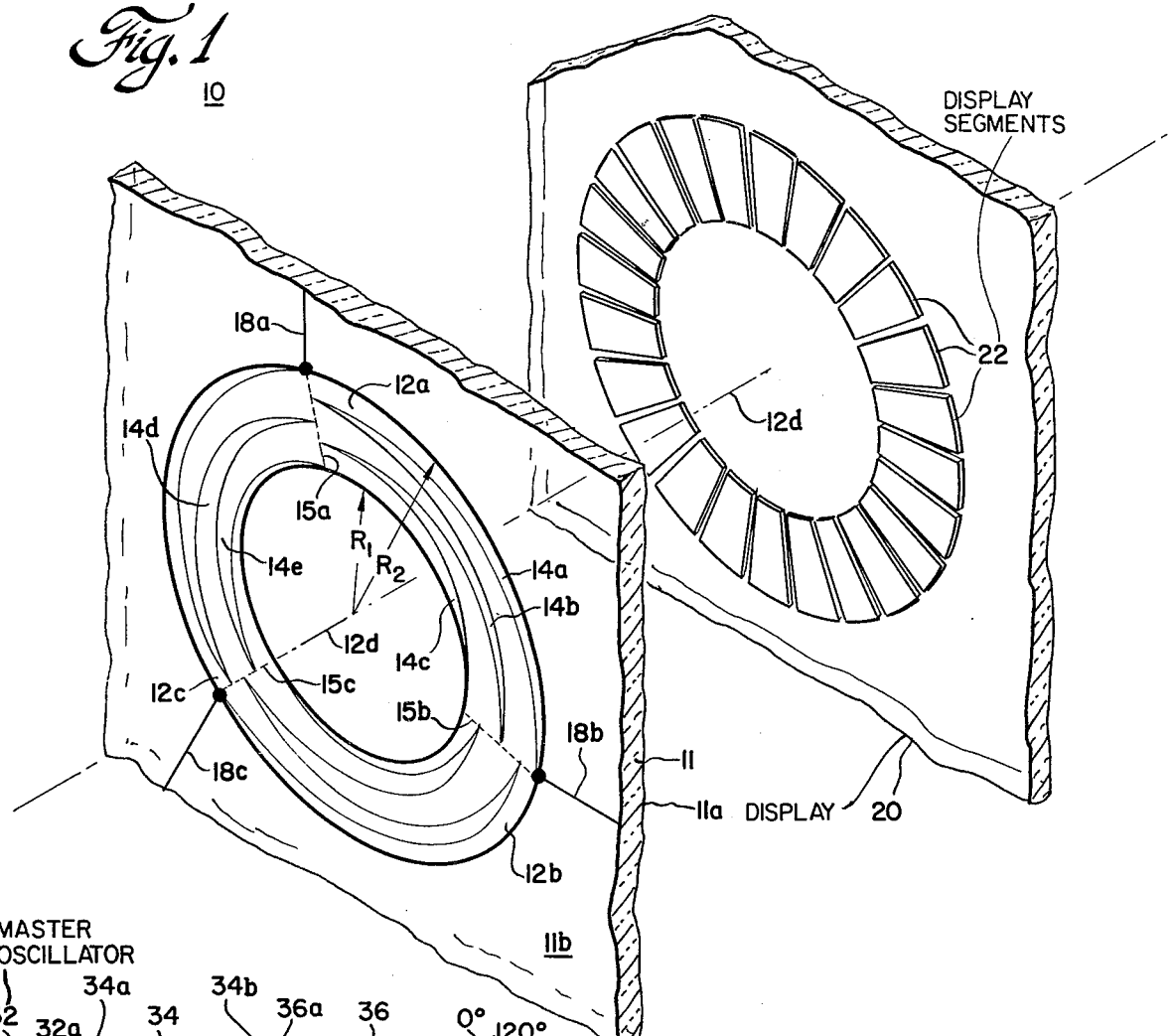
FIG. 1 is an exploded perspective view of one presently preferred embodiment of a novel capacitive touch control in accordance with the principles of the present invention.

Referring now to FIG. 1, a novel capacitive touch control 10 is fabricated upon a surface 11a of a panel 11 formed of a substantially transparent and insulative material, such as glass, plastic and the like. Panel surface 11a is furthest from the operator and the opposite panel surface 11b is so positioned as to be contacted by a member, such as a human digit and the like, having a capacitance to ground. Typically, apparatus (not shown) behind panel surface 11a carries electrical potentials and currents hazardous to the safety of personnel; the insulative panel 11 is interposed between this apparatus and such personnel, whereby the user has ready access only to the forward surface 11b of the panel. It will be appreciated that openings in panel 11, even for the purpose of allowing control knobs to protrude therethrough, is undesirable, as are actual protrusions of any conductive material from the space behind panel surface 11a into the space forward of panel surface 11b. Accordingly, panel 11 is preferably a solid and unbroken panel.

A plurality M of interdigitated conductive input electrodes (for example, the M=3 electrodes 12a–12c illustrated in the drawings) are positioned in annular fashion about a central axis 12d, with each electrode insulated from the others. Each electrode includes a plurality of tapered, arcuate finger portions, e.g. fingers portions 14a–14e of electrode 12a; the finger portions extend in one or the other direction about the annulus, from the center line 15a–15c respectively, of each electrode, which centerlines are spaced with substantially equal angular separation, of about (360/M) degrees, about the annulus. The fingers of any electrode extend toward the centerlines defined for the pair of adjacent electrodes and the angular extent of each electrode is thus (2×360/M) degrees. In the illustrated embodiment, the annulus, having inner radius $R_1$ and outer radius $R_2$, has the centerline 15a of the first electrode in the upwardly-vertical position, at "12 o'clock", and, therefore, has the remaining two centerlines positioned at 120 degrees either side thereof, i.e. at the "four o'clock" positions. Each centerline has a pair of finger portions extending counter-clockwise therefrom, with the finger edges starting respectively from the outer radius and from a position mid-way along the centerline, and from the midcenterline and the inner radius positions; three additional finger portions extend clockwise from the centerline, with the finger edges starting (a) at the outer radius and from a point on the centerline at one-quarter of the annulus width, e.g. ($R_2-R_1$), inwardly therefrom; (b) from the one-quarter inward point at a point three-quarters of the annulus width inwardly therefrom; and (c) from the three-quarter inward point and at the inner radius.

Each of the input electrodes 12a–12c has a separate electrical lead 18a–18c, respectively, extending therefrom to circuitry (described hereinbelow) for recognizing a change in capacitance between the interdigitated fingers of a pair of adjacent electrodes. Each of leads 18a–18c is routed in such manner as to be insulated from each of the remaining leads, and each lead typically comprises a conductive film plated upon rear surface 11b of the substantially transparent panel. Advantageously, the material utilized for fabricating electrodes 12 and leads 18 may be of a light-transmissive material, such as tin oxide, indium oxide, indium tin oxide and the like. It should be understood that, while three interdigitated electrodes 12a–12c are illustrated herein, a minimum of two such electrodes or any greater number of input electrodes may be equally as well utilized without departing from the concept and intent of the present invention. Further, appropriate index markings may be typically radially disposed upon external substrate surface 11b, or, if substrate 11 is of an optically transparent material, may be disposed upon interior surface 11a, to serve as a control position indication for guiding contact of a human digit and the like to a point on the annular pattern for inputting a desired quantity.

Figure 2:
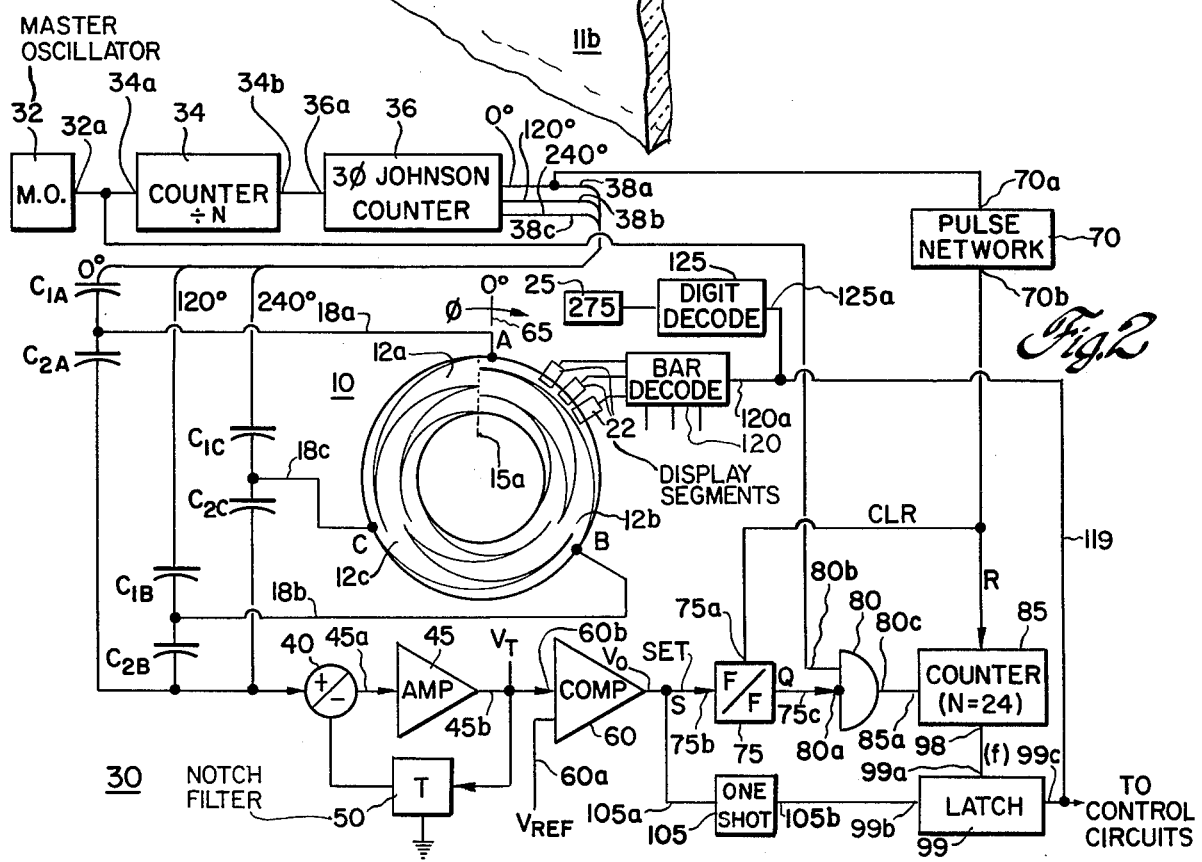
FIG. 2 is a schematic block diagram of electronic circuitry for use in the present invention for ascertaining the position of the touching member and for displaying positional data.

In one preferred embodiment, a substantially circular light-bar display 20 is utilized to indicate the amount of circular movement, from an arbitrary reference point, mark on other indicia, upon the panel. The light-bar assembly, which may be of gas discharge, liquid crystal or other electroluminescent type, may have a multiplicity of arcuate segments 22 consecutively arranged along a major portion of the periphery of a circle, centered upon the touch control central axis 12d. Segments 22 may have maximum and minimum radii, respectively, approximately equal to the maximum and minimum radii $R_2$ and $R_1$ of the interdigitated electrode annulus, if the electrodes 12 are fabricated of a substantially transparent conductor material, or may have a maximum radius not less than the outer radius $R_2$ of the electrode annulus, if the electrodes are fabricated of a light-opaque material and the panel 11 is fabricated of a light-transmissive material. Thus, the electrically-induced luminesence is visible either through, or adjacent to the edge of, the control electrode assembly, when the user is viewing panel front surface 11b. A typical type of light-bar display 20, and the electronics required to actuate the same in multiplex manner, may be as described in U.S. Pat. No. 4,060,801, incorporated herein by reference. Alternatively, or in addition thereto, other forms of displays for indicating the control condition of the touch control apparatus may be utilized. As previously mentioned hereinabove, at least one reference point, which may be an "OFF" marking (not shown for reasons of simplicity) will be utilized to facilitate rapid recognition by the user of at least the control starting position. Alternatively, a digital display 25 (FIG. 2) may be used (as hereinbelow explained) and may be positioned upon the panel at a convenient location, which may be remote from the control electrode assembly.

Considering now FIGS. 2, 3, 3a and 4a–4i, the control system includes control assembly 10 and electronic circuitry 30 for recognizing the rotational position of the digit or member in proximity to the control electrodes. A master oscillator 32 produces, at its output 32a, a waveform of substantially constant frequency F. Oscillator output 32a is coupled to the counting input 34a of a counter 34 which divides the oscillator frequency F by an integer value N, where N is chosen in accordance with the angular resolution required of the control assembly. In the illustrated embodiment, N=24 to achieve recognizable control increments of (360°/24) or 15°. It should be understood that a lesser or greater number of angular setting increments is achievable by respectively decreasing or increasing the division ratio of counter 34; e.g. for angular increments of 10°, N=(360°/10°)=36. A counter output 34b provides a square wave of frequency f'(=F/N) with one output cycle occurring for every N cycles of the master oscillator. Counter output 34b is coupled to the input 36a of an M-phase Johnson counter 36 (which may be designed in accordance with the description at pages 125 and 126 of the "RCA COS-MOS Integrated Circuits Manual" 1972). The number of phases M is equal to the number M of electrodes 12 utilized in the control electrode assembly 10; in the illustrated embodiment, three electrodes, each substantially subtending 120°, are used. Thus, M=3 and a three-phase Johnson counter is utilized. The counter has a plurality of outputs 38a–38c, equal in number to the number of electrodes 12 utilized; in the illustrated embodiment, three outputs provide three square-wave signals. Each signal is at the same frequency F' and the signals are offset from one another by 120°, i.e. the 360° in a full cycle divided by the number M of segments, e.g. three. Thus, a first output 38a, provides a first square-waveform (FIG. 4a) having a rising edge transition at some time t=0 and having a one-cycle time interval $\tau$ equal to the reciprocal of the frequency (F/N) at counter input 36a, i.e. $\tau$=N/F. The second counter output 38b waveform (FIG. 4b) has the same one-cycle time interval $\tau$, but has its rising edge at a time t=$t_1$, which rising edge occurs one-third of the time interval $\tau$ after the rising edge of the zero degree waveform of FIG. 4a. The third counter output 38c waveform is (FIG. 4c) a square wave of similar time interval $\tau$ and has its rising edge occurring at a time t=$t_2$, delayed by two-third of a cycle from the rising edge of the zero degree output 38a. Thus, for a general, M-electrode control assembly, the M outputs of the M-phase Johnson counter will have a square wave of the same frequency (and hence the same one-cycle time duration) with the rising edge of each successive output being delayed by (360/M) degrees from the rising edge of the preceding output.

The 0° counter output 38a is coupled via a first electrical capacitive $C_{1A}$ to lead 18a connected to first electrode 12a, while the 120° output 38b is coupled via a capacitance $C_{2A}$ to lead 18b connected to second electrode 12b, and the 240° output 38c is coupled via a capacitance $C_{1C}$ to lead 18c connected to electrode 12c. The magnitudes of capacitances $C_{1A}$, $C_{1B}$ and $C_{1C}$ are advantageously substantially identical. Each of leads 18a–18c is coupled through an associated electrical capacitance $C_{2A}$, $C_{2B}$, or $C_{2C}$, respectively, to the positive (+) port of a summing junction 40, at the input 45a of a high-gain operational amplifier 45. The operational amplifier output 45b is coupled to a negative (−) port of the summing junction 40 through a "T", or notch, filter 50. The frequency of the T-notch filter is set equal to the master oscillator frequency divided by the division modulus N of counter 34, i.e. the T-notch frequency equals F/N, whereby the output voltage $V_T$ (FIG. 4d) of amplifier 45 is a sinusoidal voltage recovered from the fundamental frequency of a varying phase, single-frequency waveform differentially capacitively coupled to the summing junction from counter 36.

The varying phase, single frequency waveform results from the location of a member impedance, shown as a capacitance $C_M$ (FIG. 3), loading the junction between the series-arranged first and second capacitances $C_1$ and $C_2$ between the signal generator 42 (comprising master oscillator 32, counter 34 and Johnson counter 36), and the summing junction input node 40'. The signal generator output 42a is of some amplitude V and at the same phase angle $\theta$; the contact position of the member impedance (capacitance $C_M$) on the pattern determines the loading and therefore determines the amplitude and phase angle of the voltage contributed at node 40', through the circuit consisting of $C_1$, $C_M$, $C_2$ and the node impedance Z (the input impedance looking from node 40' into amplifier 45 and filter 50). Thus, each of the three branches contributes a voltage of magnitude aV (where a is less than 1) with a waveform phase angle equal to the input waveform phase angle, and the magnitude is dependent upon the location of the member contact to the interdigitated electrodes 12. The voltages at node 40' due to the other phase-shifting networks (illustratively as coupled to node 40' from capacitances $C_{2B}$ and $C_{2C}$ of FIG. 2) have other amplitudes and phase angles. Therefore, the first, second and third phase outputs of counters 36 may be represented as voltages, at node 40', of $V_A \angle 0°$, $V_B \angle 120°$ and $V_C \angle 240°$; respectively, where $V_A$, $V_B$ and $V_C$ are each equal to, or less than, the magnitude V at the signal generator output associated therewith. The resulting voltage 40', due to each of the M phases (illustratively, M=3 phases) is added victorially, as shown in FIG. 3a. For example, if the user touches a fingertip to the annular electrodes 12 at a point on the annulus thereof, the zero phase voltage contribution may have a magnitude $V_A$, less than the 120° phase voltage contribution of magnitude $V_B$, and both less than the 240° phase voltage contribution of magnitude $V_C$. The three voltages add in vector fashion to give a resultant voltage $V_R$ indicative of the rotational position about the annulus at which the member touches the electrodes. Thus, the summation of the vector voltages will rotate in a continuous, although not necessarily linear fashion, as the user's digit successively touches more of the panel over one of the electrodes 12a, 12b or 12c than of the others. The resulting voltage, is however, of the frequency obtained at the output of counter 36, and only the phase angle changes thereof, whereby the use of the filter/amplifier provides a sinusoidal output $V_T$ (FIG. 4d) having a zero crossing 67 changing in time, relative to the t=o position, in response to the changing angular rotation of contact of a member upon the annulus of electrodes.

A comparator 60 receives a reference voltage $V_{REF}$ at a first input 60a and receives the T-notch amplifier output voltage $V_T$ at a second input 60b. The reference voltage is advantageously established such that the output voltage $V_O$ (FIG. 4e) of the comparator changes polarity when the T-notch filter output voltage $V_T$ crosses the zero voltage level. Illustratively, a 0° reference position 65 is established at the centerline 15a of electrode 12a, with angular rotation $\phi$ being read in a clockwise direction between the reference mark 65 and the position, along the annulus, at which a member, having a capacitance to ground, contacts the panel above electrodes 12. The illustrated waveforms are for the case in which the member (e.g. a finger) contacts electrodes at an angle $\phi = 60°$ from zero reference 65. Thus, the T-notch output voltage waveform has a zero crossing point 67 after a time interval equal to one-sixth of a cycle with respect to time T=0 (as the movable electrode angular displacement is $60°/360° = 1/6$). Immediately prior to $V_T$ zero crossing 67, the comparator output voltage $V_O$ is negative, indicative of the filter output voltage $V_T$ being less than zero, with a positive transition 68 occurring in voltage waveform $V_O$ essentially coincidental with zero crossing 67 initiated by a positive excursion of filter output voltage $V_T$.

A pulse network 70 has its input 70a coupled to the zero-degree-phase counter output 38a and provides, at a network output 70b, a short duration clear (CLR) pulse (FIG. 4f) at the occurrence of each leading edge of the zero-degree-phase square-wave from counter 36. The CLR pulse is coupled to a CLEAR input 75a of a flip-flop (F/F) 75, receiving the comparator output voltage waveform $V_O$, as a SET input 75b thereof. The flip-flop output 75c has a waveform Q (FIG. 4g) which is cleared to a substantially zero-voltage value upon receipt of the CLR output pulse 78 of network 70, i.e. at the time t=0, and which remains at zero level until the output is set to a logic-one level by the positive-going transition 68 of the comparator output waveform $V_O$. Thus, in the illustrative example, the transition 77 of the Q waveform from a logic-zero level to a logic-one level, occurs essentially with a 60° difference from the t=0 commencement of the zero-degree-phase waveform. The flip-flop output waveform is maintained at a logic-one level until subsequently cleared by the presence of another CLR pulse 78a at CLEAR input 75a, coincident with the next rising edge of the zero-degree-phase waveform.

The flip-flop output waveform Q is inverted at a first input 80a of a two-input AND gate 80, having a remaining, non-inverting input 80b coupled to the output 32a of the master oscillator. The output 80c of gate 80 is coupled to the counting input 85a of a count-to-N counter 85. The maximum count N of counter 85 is equal to the division ration N of counter 34, which in the illustrative example is N=24. Counter 85 also has a reset input R coupled to the output 70b of the pulse network. Thus, the pulse at network output 70b, occurring essentially at time t=0, resets counter 85 to a count of zero, such that the Q output 75 of the flip-flop, when inverted at gate input 80a, causes gate 80 to conduct and allow a number of master oscillator output pulses to be transmitted to the counter input 85a. The number of oscillator pulses gated to the counter increases for increasing time duration of the flip-flop Q output remaining at a logic-zero level (between resetting of the flip-flop by the CLR pulse and the appearance of the Q waveform rising edge transition 77). The gating interval is thus proportional to the angular displacement of the member (e.g. user's finger) on electrodes 12 from zero degree reference 65, and allows a gated "burst" 97 of master oscillator pulses (FIG. 4h) to appear at the counting input of the counter, after each zero-degree-phase rising-edge transition. The return of the F/F output to the logic-one level opens gate 80 and terminates transmittal of master oscillator pulses to the counter. A digital representation of the number of oscillator pulses gated into the counter is provided at counter outputs 98, which, in my preferred embodiment, is a set of 8 parallel output lines, coupled to the data inputs 99a of an 8-bit-wide data latch 99.

A one-shot multivibrator (OSM) 105 has its trigger input 105a coupled to the comparator output and is triggered by the rising edge transition 68 of the $V_O$ waveform to provide a positive pulse 107 (FIG. 4a) at the OSM output 105b. The OSM output pulse is coupled to a control input 99b of latch 99, and causes the data appearing at data inputs 99a to be loaded into the latch and stored therein until receipt of a next subsequent control pulse 107' at control input 99b. Thus, digital data representative of the angular displacement between the imaginary zero angular reference point 65 and the movable position at which a member contacts electrodes 12, is presented, in sampled fashion, at latch outputs 99c.

In my preferred embodiment, the latched angular displacement data is routed, via an eight-bit-wide data bus 119 to the input 120a of a bar-decode circuit 120 and the input 125a of a digit-decode circuit 125. The decoders 120 and 125 recognize, via means known to the art, the particular digital data representations of the N possible rotational sectors within which the electrode-contact position may be recognized, and cause an appropriate indication to be made visible. Thus, bar-decode circuitry 120 is coupled to each of the illuminable segments 22 such that the appropriate one, or ones, of these segments will be illuminated to signify the present position (or, as latch 99 stores data, the last touch position) of user contact to electrodes 12. Digit decoder circuitry 125 is coupled to digital display 25 to present a numerical indication of control setting (where the angular position of user contact of electrodes 12 is related, in some desired manner, to some numerical criteria, such as the temperature setting for a cooking oven and the like). Data is coupled to additional circuitry (not shown for purposes of simplicity) from latch output 99c, or the outputs of either decoding circuitry 120 or 125, to initiate control of a parameter, such as the afore-mentioned temperature in an electrical cooking oven, by known means utilizing and processing the control knob digital outputs from latch outputs 99c. The latch outputs are held constant between each sampling actuation 107, whereby a first control assembly data sample $S_1$ appears (FIG. 4i) at latch output 99c after a first latch control input 107 and is maintained until the next subsequent latch control input enablement 107' occurs. Similarly, immediately after latch control signal 107' occurs, the latch stores a second data sample $S_2$ indicative of the angular position of the last previous contact to electrodes 12 immediately prior to enablement signal 107'; sample $S_2$ is stored until the next subsequent enablement signal 107" enables a third sample $S_3$, and so forth.

Referring to FIG. 5, a linear electrode array may comprise interdigitated electrodes 12a', 12b', 12c' and 12d' linearly disposed such that finger portions, e.g. 14a' and 14b', of one electrode, e.g. 12a', are between finger portions, e.g. 14c', 14d' and 14e', of an adjacent electrode, e.g. 12b'. The outermost electrodes, e.g. 12a' and 12d' are both driven by the zero-phase waveform, via leads 18a' and 18d', respectively, while the intermediate electrodes, e.g. 12b' and 12c', are driven by successively greater phase-angle waveforms, e.g. the 120° and 240° phase-shifted square-waves, respectively, via respective leads 18b' and 18c'. Thus, a linear array would have M phases of a driving waveform (e.g. M=3) and (M+1) electrodes (e.g. M+1=4) electrically insulated from each other with the outermost electrodes electrically coupled together. The position of a member touching the pattern, or the panel above the pattern, is translated, by circuitry similar to that shown in FIG. 2, into a signal, or count, indicative of the touched position.

While several presently preferred embodiments of the present invention have been described, many variations and modifications will now become apparent to those skilled in the art. In particular, electrodes of other shapes may be utilized, especially to achieve highly linear phase versus rotation relationships. It is my intent, therefore, to be limited only by the scope of the appended claims, rather than by the illustrative embodiments described herein.

What is claimed is:

1. A capacitive control assembly activatable by positional contact by a member having an impedance to electrical ground potential, comprising:

a solid panel having front and rear surfaces;

a plurality (M) of electrodes, where M is an integer greater than one, disposed along a preselected geometric curve and fabricated upon one of said panel surfaces; each of said M electrodes insulated from the others of said electrodes;

means coupled to each electrode for providing one of a like plurality (M) of signals thereto; each signal having the same frequency as all other signals and having a phase differing by (360/M) degrees from the phases of the signals coupled to adjacent electrodes; said signal providing means including first means for producing a train of pulse signals at a frequency F, second means receiving said train of pulse signals for producing a plurality (M) of square wave outputs each having a frequency (F') equal to (F/N), where N is an integer greater than one, and each successive one of said plurality of square waves having a phase difference of (360/M) degrees with respect to the next preceding and next subsequent square wave; each successive square wave output of said second means being coupled to a successive one of said plurality of electrodes, commencing at a particular one of said electrodes associated with a reference point; and means connected to each of said plurality of electrodes for recognizing the phase of the summation of all of said square wave outputs after coupling to said electrodes to determine the location of said contact position of said member on said panel above said electrodes, with respect to said reference point; said recognizing means including third means coupled to said electrodes for recovering from said electrodes a periodic waveform having a frequency equal to the frequency (F') of said square wave outputs and crossing a predetermined level at a time, after a predetermined transition of the square wave coupled to the electrode associated with said reference point, related to the position of said member contact with respect to said reference point; and fourth means coupled to said first and third means for counting the pulses from said first means during the time interval between said predetermined transition and said predetermined level crossing to obtain a digital representation of the position of said member contact with respect to said reference point.

2. The control assembly of claim 1, wherein said plurality of electrodes are disposed about a common center, with a centerline of each pair of adjacent electrodes separated from one another by an angle about said common center substantially equal to (360/M) degrees.

3. The control assembly as set forth in claim 1, wherein said second means comprises a M-phase Johnson counter.

4. The control assembly as set forth in claim 3, wherein the number M of electrodes, and the number of phases in said Johnson counter, is three.

5. The control assembly as set forth in claim 3, wherein said second means includes a counter coupled between said first means and said Johnson counter for dividing by an integer N the frequency of the first means pulse signals received by said Johnson counter.

6. The control assembly as set forth in claim 5, wherein N=24.

7. The control assembly as set forth in claim 1, wherein said third means comprises a comparator having a first input receiving a reference level and a second input receiving the summation of the square wave outputs of said second means after coupling to each of said electrodes.

8. The control assembly set forth in claim 7, wherein said third means further comprises fifth means, interposed between said electrodes and said comparator receiving the summation of the square wave outputs of said second means after coupling to each of said electrodes, for recovering only the fundamental sinusoidal component of the summed square wave outputs from said electrodes for coupling to said comparator second input.

9. The control assembly as set forth in claim 8, wherein said fifth means comprises an operational amplifier having an output and a summing junction input individually capacitively connected to each of said electrodes, and a T-notch filter coupled to provide negative feedback between said operational amplifier output and said summing junction input.

10. The control assembly as set forth in claim 1 wherein said fourth means includes means for counting at least N consecutive pulses;
means for gating the pulse train from said first means to said counting means; and
means for enabling said gating means only in the time interval between said predetermined transition and said predetermined level crossing.

11. The control assembly as set forth in claim 10 wherein said counting means is reset to a predetermined count at the occurrence of said predetermined transition.

12. The control assembly as set forth in claim 1, wherein each electrode has a plurality of finger portions, at least one finger portion of each electrode being interdigitated between finger portions of an adjacent electrode.

13. The control assembly as set forth in claim 12 wherein the number M of electrodes is at least three.

14. The control assembly of claim 12 wherein said electrodes are arranged in an annulus about said common center.

* * * * *